(12) United States Patent
Ahmad et al.

(10) Patent No.: US 6,444,529 B2
(45) Date of Patent: *Sep. 3, 2002

(54) METHODS OF FORMING INTEGRATED CIRCUITRY AND METHODS OF FORMING ELEVATED SOURCE/DRAIN REGIONS OF A FIELD EFFECT TRANSISTOR

(75) Inventors: Aftab Ahmad, Colorado Springs, CO (US); Lyle Jones, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/771,449

(22) Filed: Jan. 26, 2001

Related U.S. Application Data (63) Continuation of application No. 09/203,541, filed on Dec. 1, 1998, now Pat. No. 6,211,026.

(51) Int. Cl.[7] ............................................. H01L 21/336
(52) U.S. Cl. ...................................................... 438/300
(58) Field of Search ................................. 438/300, 275, 438/303, 305, 947

(56) References Cited

U.S. PATENT DOCUMENTS

| | | | |
|---|---|---|---|
| 4,587,710 A | 5/1986 | Tsao ............................... | 29/571 |
| 4,784,971 A | 11/1988 | Chiu et al. ...................... | 437/57 |
| 4,948,745 A | 8/1990 | Pfiester et al. ................. | 437/41 |
| 5,314,832 A | 5/1994 | Deleonibus .................... | 437/27 |
| 5,352,631 A | 10/1994 | Sitaram et al. ............... | 437/200 |
| 5,395,787 A | 3/1995 | Lee et al. ....................... | 437/57 |
| 5,496,750 A | 3/1996 | Moslehi ......................... | 437/41 |
| 5,504,031 A | 4/1996 | Hsu et al. ...................... | 437/57 |
| 5,571,733 A | 11/1996 | Wu et al. ....................... | 437/34 |
| 5,637,518 A | 6/1997 | Prall et al. ................... | 438/301 |
| 5,674,774 A | 10/1997 | Pasch et al. ................... | 437/41 |
| 5,731,239 A | 3/1998 | Wong et al. ................. | 438/296 |
| 5,773,358 A * | 6/1998 | Wu et al. ..................... | 438/564 |
| 5,780,349 A | 7/1998 | Naem .......................... | 438/305 |

(List continued on next page.)

OTHER PUBLICATIONS

Wolf, "Silicon processing for the VLSI era" vol. 1, pp. 320–323 and 520–523.
Nakahara et al. Ultra–shallow in–situ–doped raised source/drain structure for sub–tenth micron CMOS, IEEE 1996 Symp, on VLSI Tech Dig. of Tech. Papers, pp. 174.
Rodder, et al Raised source/drain MOSFET with Dual Sidewall Spacers, IEEE Elect. Dev. Lett. vol. 12, No. 3, pp. 89.

*Primary Examiner*—David Nelms
*Assistant Examiner*—Quoc Hoang
(74) *Attorney, Agent, or Firm*—Wells St. John P.S.

(57) ABSTRACT

Methods of forming integrated circuitry, methods of forming elevated source/drain regions, and methods of forming field effect transistors are described. In one embodiment, a transistor gate line is formed over a semiconductive substrate. A layer comprising undoped semiconductive material is formed laterally proximate the transistor gate line and joins with semiconductive material of the substrate and comprises elevated source/drain material for a transistor of the line. Subsequently, conductivity-modifying impurity is provided into the elevated source/drain material. In another embodiment, a common step is utilized to provide conductivity enhancing impurity into both elevated source/drain material and material of the gate line. In another embodiment, the undoped semiconductive layer is first patterned and etched to provide elevated source/drain regions prior to provision of the conductivity-modifying impurity. In another embodiment, the semiconductive material is first patterned with conductivity modifying impurity being provided into selected portions of the semiconductive material. Undoped semiconductive portions are subsequently removed selectively relative to doped semiconductive material portions.

20 Claims, 9 Drawing Sheets

U.S. PATENT DOCUMENTS

| | | | |
|---|---|---|---|
| 5,811,329 A | 9/1998 | Ahmad et al. | 438/233 |
| 5,827,768 A | 10/1998 | Lin et al. | 438/300 |
| 5,851,883 A | 12/1998 | Gardner et al. | 438/275 |
| 5,885,877 A | 3/1999 | Gardner et al. | 438/300 |
| 5,897,357 A | 4/1999 | Wu et al. | 438/300 |
| 5,902,125 A | 5/1999 | Wu | 438/300 |
| 5,915,183 A | 6/1999 | Gambino et al. | 438/300 |
| 5,953,605 A | 9/1999 | Kodama | 438/231 |
| 5,998,844 A * | 12/1999 | Prall et al. | 257/377 |
| 6,001,698 A | 12/1999 | Kodura | 438/303 |
| 6,083,798 A * | 7/2000 | Lin | 438/297 |
| 6,239,472 B1 * | 5/2001 | Shenoy | 257/408 |
| 6,313,505 B2 * | 11/2001 | Yu | 257/336 |

* cited by examiner

_Fig. 1_

_Fig. 2_

_Fig. 3_

F I G. III

METHODS OF FORMING INTEGRATED CIRCUITRY AND METHODS OF FORMING ELEVATED SOURCE/DRAIN REGIONS OF A FIELD EFFECT TRANSISTOR

RELATED PATENT DATA

This patent resulted from a continuation application of U.S. application Ser. No. 09/203,541, filed Dec. 1, 1998, entitled "Methods of Forming Integrated Circuitry, Methods of Forming Elevated Source/Drain Regions of a Field Effect Transistor, and Methods of Forming Field Effect Transistors," naming Ahmad et al. as inventors, and which is now U.S. Pat. No. 6,211,026, the disclosure of which is incorporated by reference herein.

TECHNICAL FIELD

This invention relates to methods of forming integrated circuitry, to methods of forming elevated source/drain regions of a field effect transistor, and to methods of forming field effect transistors.

BACKGROUND OF THE INVENTION

As integrated circuitry device dimensions continue to shrink, problems such as short channel effects, source-drain punchthrough, and hot electron susceptibility become ever present, particularly in the deep sub-half-micron regime. These effects have, in the past, been addressed by additional masking levels and through the incorporation of lightly doped drain (LDD) engineering.

This invention arose out of concerns associated with providing improved integrated circuitry devices while reducing problems associated with short channel effects, source-drain punchthrough, and hot electron susceptibility, particularly in the deep sub-half-micron regime.

SUMMARY OF THE INVENTION

Methods of forming integrated circuitry, methods of forming elevated source/drain regions, and methods of forming field effect transistors are described. In one embodiment, a transistor gate line is formed over a semiconductive substrate. A layer comprising undoped semiconductive material is formed laterally proximate the transistor gate line and joins with semiconductive material of the substrate and comprises elevated source/drain material for a transistor of the line. Subsequently, conductivity-modifying impurity is provided into the elevated source/drain material. In another embodiment, a common step is utilized to provide conductivity enhancing impurity into both elevated source/drain material and material of the gate line. In another embodiment, the undoped semiconductive layer is first patterned and etched to provide elevated source/drain regions prior to provision of the conductivity-modifying impurity. In another embodiment, the semiconductive material is first patterned, with conductivity-modifying impurity being subsequently provided into selected portions of the semiconductive material. Undoped semiconductive portions are subsequently removed selectively relative to doped semiconductive material portions.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
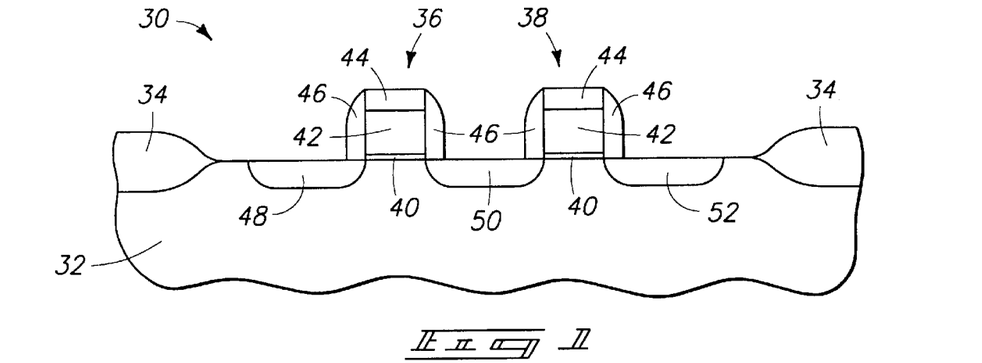
FIG. 1 is a diagrammatic side sectional view of a semiconductor wafer fragment in process in accordance with one embodiment of the present invention.

Referring to FIG. 1, a semiconductor wafer fragment in process is shown generally at 30 and includes a semiconductive substrate 32. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Isolation regions 34 are formed within substrate 32 and comprise an oxide material. A plurality of lines, e.g. transistor gate lines are formed over the substrate with exemplary gate lines being shown at 36, 38 respectively. Gate lines 36, 38 include a gate oxide layer 40, a layer of semiconductive material 42, and insulative material caps 44. In this example, layer 42 comprises undoped semiconductive gate line material, with undoped polysilicon being an exemplary material. In the context of this document, "undoped" will be understood to include those materials which, as deposited or formed, do not include meaningful amounts of p-type or n-type materials. An exemplary material for insulative caps 44 is silicon dioxide. For purposes of the ongoing discussion, layer 42 constitutes a layer of first-formed semiconductive material.

Gate lines 36, 38 constitute a pair of spaced-apart gate lines which, in a preferred embodiment, comprise a portion of dynamic random access memory (DRAM) circuitry. Sidewall spacers 46 are formed over transistor gate lines 36, 38 and can comprise nitride and/or oxide materials. Source/drain diffusion regions 48, 50, and 52 are formed within and received by substrate 32.

Figure 2:
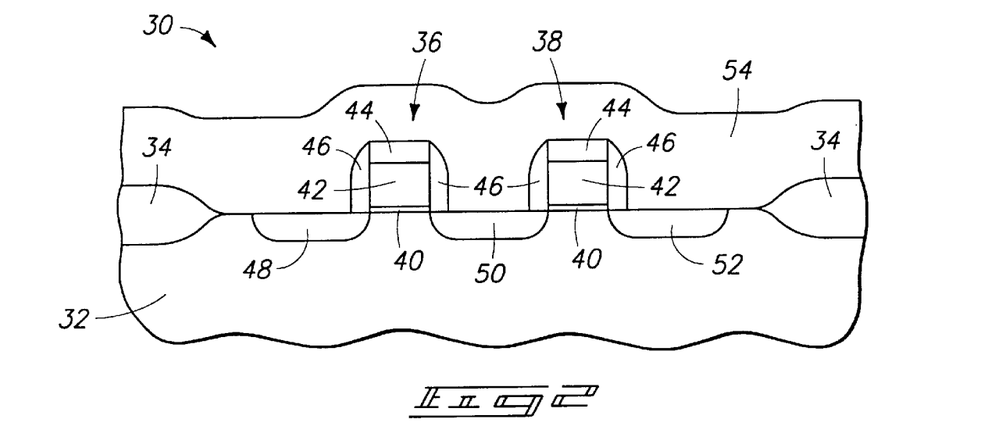
FIG. 2 is a view of the FIG. 1 wafer fragment at a processing step which is subsequent to that which is shown in FIG. 1.

Referring to FIG. 2, a material layer 54 is formed over substrate 32, and preferably comprises an undoped semiconductive material. Layer 54 constitutes a second-formed layer of semiconductive material which is formed laterally proximate gate lines 36, 38 and joins with semiconductive material of substrate 32 laterally proximate each gate line, e.g. diffusion regions 48, 50, and 52. As formed, layer 54 constitutes elevated source/drain material for gate lines 36, 38. An exemplary material for layer 54 is undoped polysilicon which can be formed to an elevational thickness of around 4,000 Angstrom.

Figure 3:
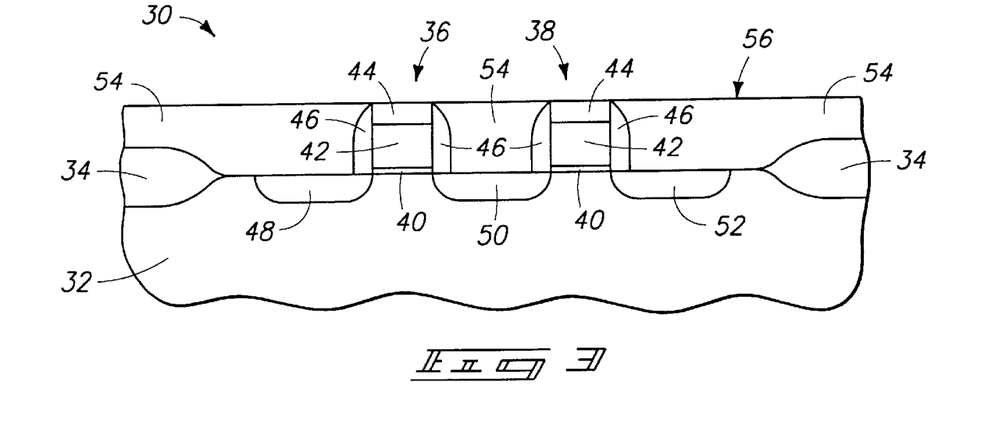
FIG. 3 is a view of the FIG. 1 wafer fragment at a processing step which is subsequent to that which is shown in FIG. 2.

Referring to FIG. 3, material of layer 54 is removed to isolate remaining material relative to the conductive lines. In this example, layer 54 is planarized, as by chemical-mechanical polishing, to provide a generally planar outer surface 56. Planarization can be made to stop on or proximate insulative caps 44. Alternately, layer 54 can be etched back, with such etching stopping on or proximate the insulative caps. Although not specifically shown, further portions of layer 54 can be removed to recess the material relative to gate lines 36, 38.

At this point in processing, insulative caps 44 can be etched away or otherwise removed from over semiconductive material 42 to expose an outer surface thereof for purposes which will become evident below. Such a construction is shown in FIG. 6.

Figure 4:
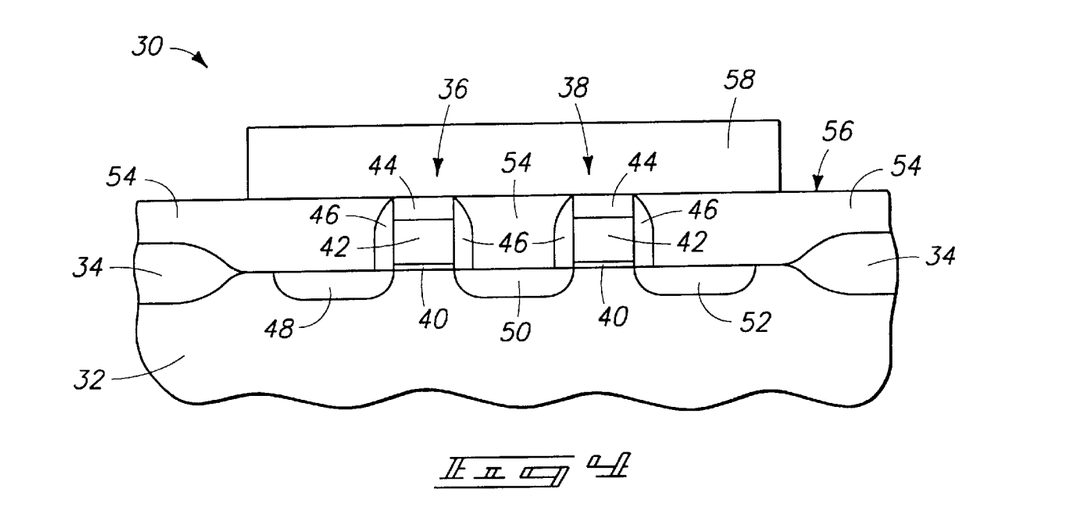
FIG. 4 is a view of the FIG. 1 wafer fragment at a processing step which is subsequent to that which is shown in FIG. 3.

Referring to FIG. 4, a patterned masking layer 58 is formed over substrate 32 and over portions of the undoped semiconductive material of layer 54. Exemplary material for layer 58 is photoresist.

Figure 5:
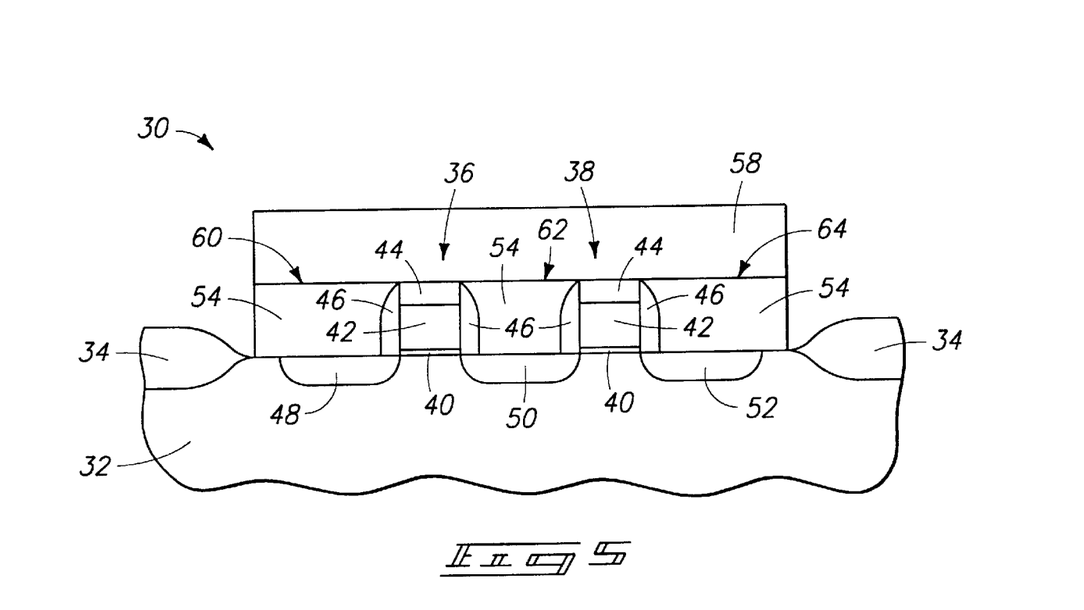
FIG. 5 is a view of the FIG. 1 wafer fragment at a processing step which is subsequent to that which is shown in FIG. 4.

Referring to FIG. 5, unmasked elevated source/drain material portions are removed to provide individual elevated source/drain regions 60, 62, and 64. In this example, such material is removed prior to provision of conductivity-modifying or conductivity-enhancing impurity thereinto. In one embodiment, the unmasked portions are etched, preferably through an anisotropic dry etch, which is sufficient to provide the elevated source/drain regions.

Figure 6:
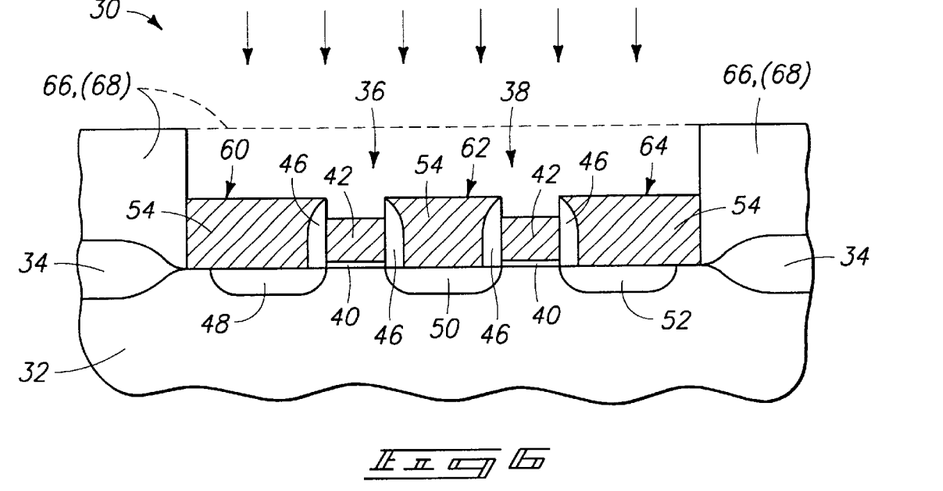
FIG. 6 is a view of the FIG. 1 wafer fragment at a processing step which is subsequent to that which is shown in FIG. 5.

Referring to FIG. 6, a patterned masking layer 66 is formed over substrate 32. In one embodiment, conductivity-modifying or conductivity-enhancing impurity is provided into the elevated source/drain material of regions 60, 62, and 64. In one embodiment, the insulative caps 44 are preferably removed and provision of the impurity comprises also providing the impurity into the exposed, undoped semiconductive gate line material 42. Accordingly, such can constitute in a common step, providing impurity into both the lines and source/drain regions proximate thereto to form highest conductive portions of the source/drain regions and render the undoped semiconductive material of the line conductive. Alternately considered, this embodiment can constitute contemporaneously providing impurity into exposed undoped semiconductive gate line material 42, as well as material comprising regions 60, 62, and 64. Provision of impurity can take place to a concentration of $10^{20}$ cm$^{-3}$.

In one embodiment, material of both the elevated source/drain regions 60–64, and semiconductive gate material 42 is commonly doped in different steps. Such different steps can provide different impurity doses at different energy levels. In one embodiment, the semiconductive material is doped with a first dose of impurity which is provided at a first energy level, and then a second dose of impurity which is provided at a second energy level. The first dose is preferably substantially the same as the second dose, with an exemplary dose being $5 \times 10^{12}$ atoms/cm$^2$. Preferably, the second energy level is less than the first energy level, with an exemplary first energy level being 85 keV and an exemplary second energy level being 35 keV. Such will result in concentrations of implanted impurities which vary within the semiconductive material.

In another embodiment, a first region of elevated source/drain material is masked (with patterned masking layer 66 and not specifically shown) while a second region of elevated source/drain material (e.g. regions 60, 62, and 64) is doped with an impurity of a second type. In this example, masking layer 66 can be used to open up n-channel active areas, as well as gate regions to allow implantation of the undoped polysilicon over not only the active areas, but the polysilicon gate regions as well. Exemplary material for such doping include arsenic and/or phosphorous. In accordance with this embodiment, masking layer 66 is subsequently removed, and a second region of elevated source/drain material is masked, e.g. with masking layer 68, while a first region of elevated source/drain material (not specifically shown but disposed within masking layer openings which are substantially similar to the opening defined by previous masking layer 66) is provided with an impurity of a first type. In this example, masking layer 68 can be used to open up p-channel active areas, as well as gate regions to allow implantation of the undoped polysilicon over not only the active areas, but the polysilicon gate regions as well. Exemplary materials include boron and $BF_2$.

Figure 7:
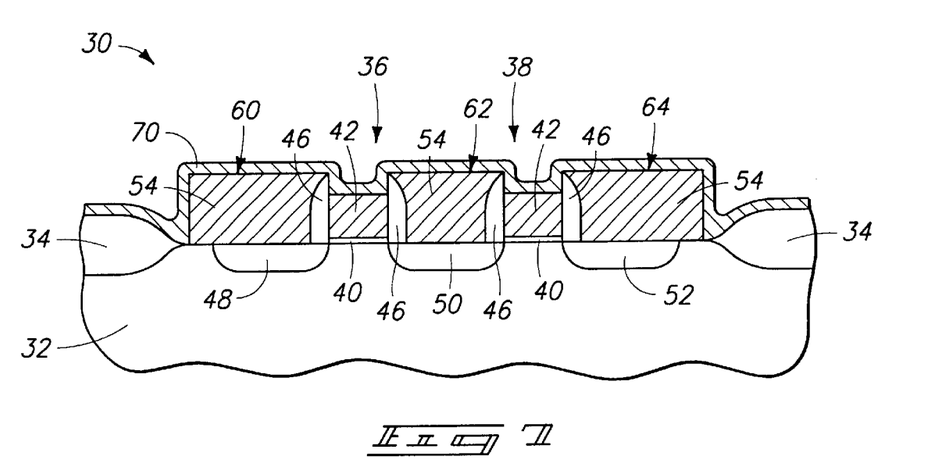
FIG. 7 is a view of the FIG. 1 wafer fragment at a processing step which is subsequent to that which is shown in FIG. 6.
Figure 8:
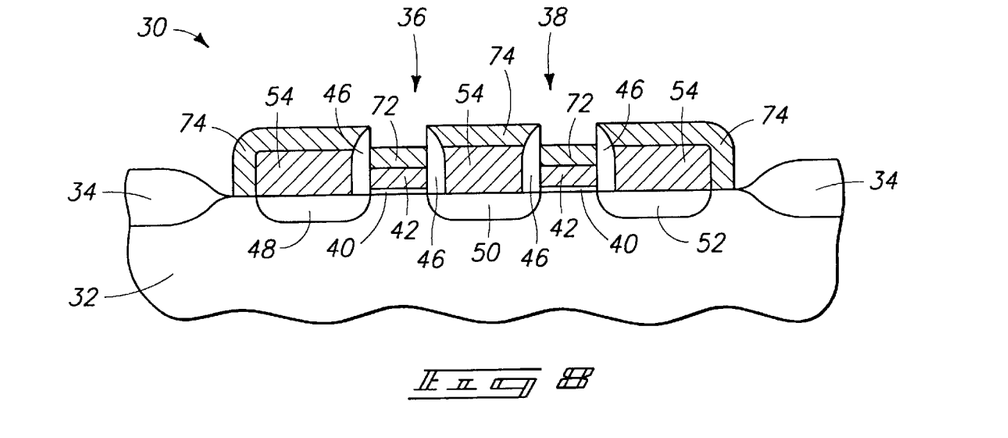
FIG. 8 is a view of the FIG. 1 wafer fragment at a processing step which is subsequent to that which is shown in FIG. 7.

Referring to FIGS. 7 and 8, a refractory metal layer 70 (FIG. 7) is formed over substrate 32. Exemplary materials include titanium and cobalt. In one embodiment, refractory metal layer 70 is formed over silicon-containing material of transistor gate lines 36, 38 and exposed to annealing conditions which are effective to render it into a conductive gate line silicide 72 (FIG. 8). In another embodiment, refractory metal layer 70 constitutes a common refractory metal layer which is formed over both exposed silicon-containing material of transistor gate lines 36, 38, and the elevated source/ drain material comprising regions 60, 62, and 64. Subsequently, layer 70 is exposed to annealing conditions which are sufficient to render it into both the gate line silicide 72 and a source/drain material silicide 74 (FIG. 8).

Referring to FIG. 8, and alternately considered, a gate line silicide layer 72 is formed over exposed material of gate lines 36, 38 respectively. Elevated source/drain region silicide layers 74 are formed over elevated source/drain material comprising portions of the source/drain regions. In a preferred embodiment, the silicide layers are contemporaneously provided over the illustrated materials.

Figure 9:
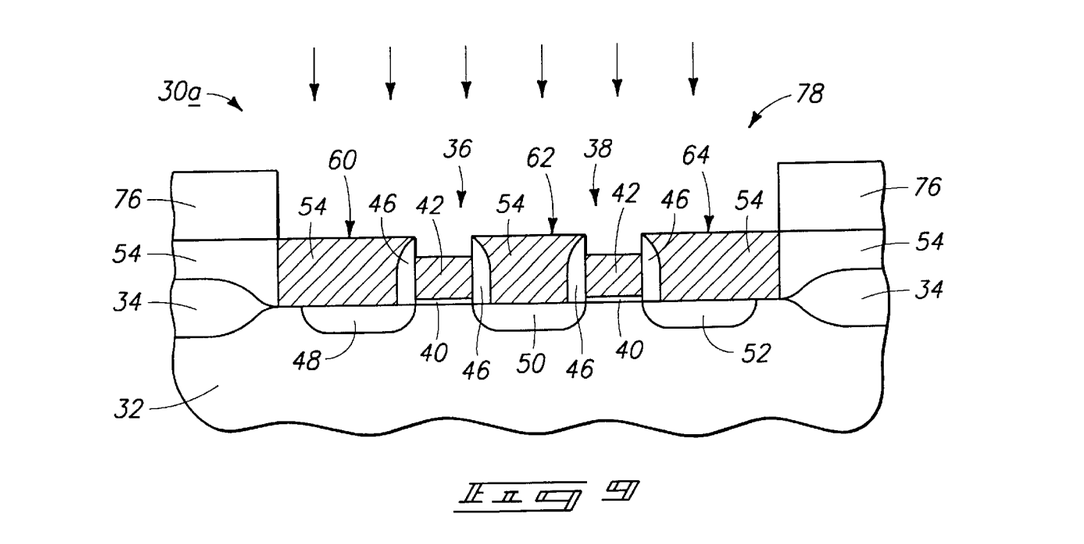
FIG. 9 is a diagrammatic side sectional view of a semiconductor wafer fragment in process in accordance with another embodiment of the present invention.

Referring to FIG. 9, a semiconductor wafer fragment in accordance with an alternate embodiment of the present invention is shown generally at 30a and includes a semiconductive substrate 32. Like numerals from the above-described embodiment have been utilized where appropriate, with differences being indicated by the suffix "a" or with different numerals.

A material layer 54 is formed over substrate 32. and processed as described above, which can include the planarization thereof. A patterned masking layer 76 is formed over the substrate including portion of undoped semiconductive material 54. Masking layer 76 defines a masking layer opening 78 which is disposed over only a portion of undoped semiconductive material of layer 54. Accordingly, material elevationally below masking layer 76 constitutes covered portions of layer 54, while exposed portions of layer 54 comprise elevated source/drain material regions for the field effect transistors. A semiconductive outer surface of gates lines 36, 38 is exposed through masking layer opening 78 (as the insulative caps thereover were previously removed).

Conductivity-modifying or conductivity-enhancing impurity is provided, preferably contemporaneously, into exposed semiconductive material 42 and exposed or unmasked portions of layer 54. Such impurity can be provided in the concentration mentioned above. Such materials can be doped as described above utilizing the first and second doses provided at the first and second energy levels, respectively. Accordingly, material of layer 54 disposed elevationally below masking layer 76 remains substantially undoped laterally outward of doped elevated source/drain regions 60, 62, and 64. After the provision of the impurity, the masking layer can be stripped.

Figure 10:
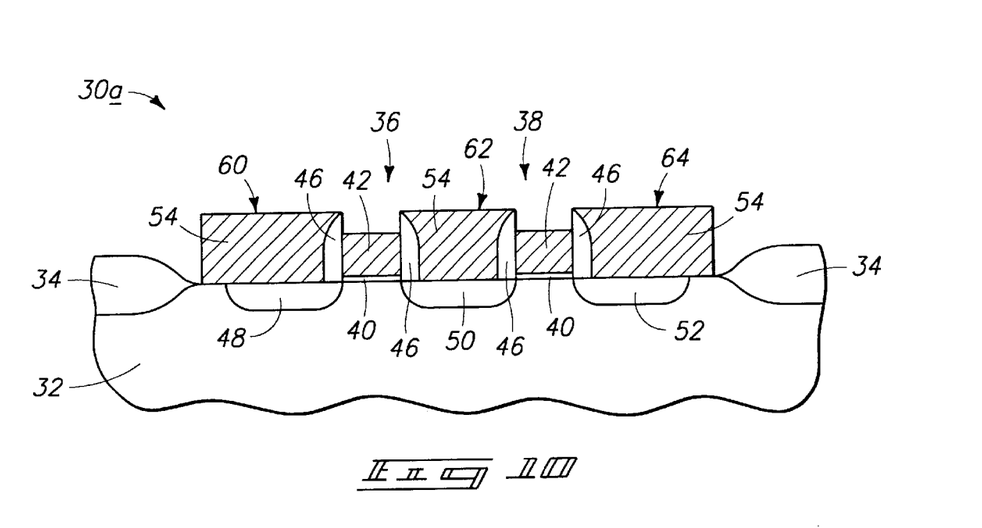
FIG. 10 is a view of the FIG. 9 wafer fragment at a processing step which is subsequent to that which is shown in FIG. 9.

Referring to FIG. 10, the undoped source/drain material portions are removed to provide elevated source/drain regions 60, 62, and 64. In a preferred embodiment, the removal of such material takes place through an etch which is effective to remove elevated source/drain material containing less impurity than elevated source/drain material containing more impurity. In the illustrated example, a wet etch is conducted which selectively removes undoped semiconductive material relative to the doped semiconductive material. By selectively is meant removing of one layer relative to another layer in a ratio of 5:1 or greater. An exemplary wet etch comprises two percent by volume tetramethyl ammonium hydroxide (TMAH) in water. Etch chemistries could, of course, be changed to achieve higher etch selectivity to doped versus undoped polysilicon. Accordingly, removal of the elevated source/drain material portions in this embodiment takes place after provision of the doping impurity and constitutes removing previously-masked portions of the semiconductive material layer to provide the elevated source/drain regions which comprise the previously-unmasked portions.

Subsequently, the substrate can be annealed such that both n+ and p+ plugs or source/drain regions, and n+ gate/p+ gate material is annealed at the same time.

Figure 11:
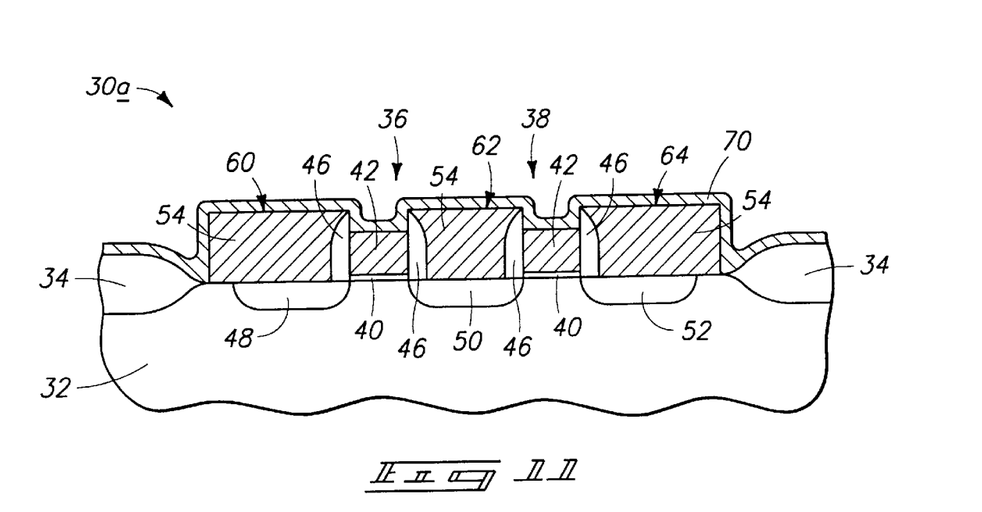
FIG. 11 is a view of the FIG. 9 wafer fragment at a processing step which is subsequent to that which is shown in FIG. 10.
Figure 12:
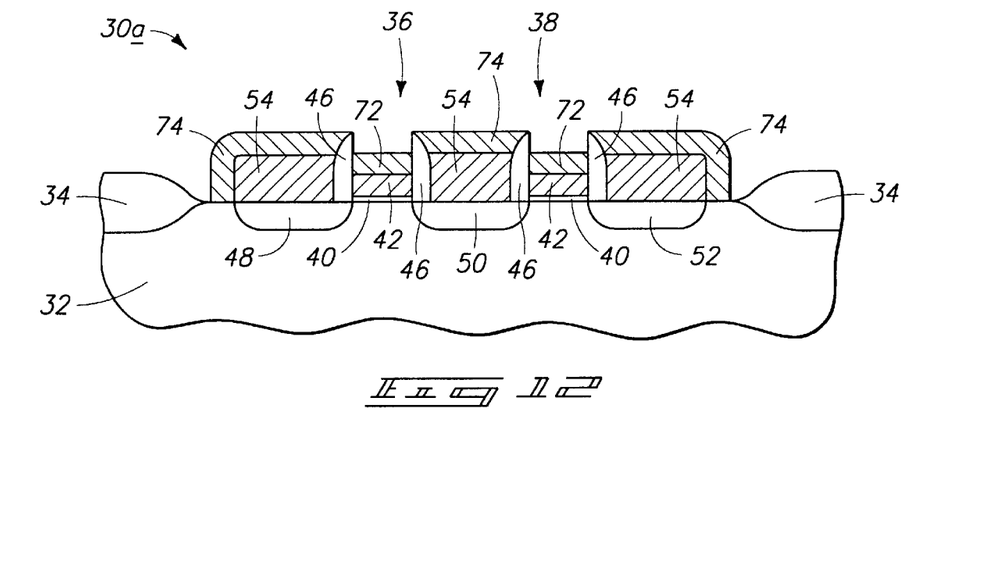
FIG. 12 is a view of the FIG. 9 wafer fragment at a processing step which is subsequent to that which is shown in FIG. 11.

Referring to FIGS. 11 and 12, a refractory metal layer 70 is formed over substrate 32. Exemplary materials include titanium and cobalt. In one embodiment, refractory metal layer 70 is formed over silicon-containing material of transistor gate lines 36, 38 and exposed to annealing conditions which are effective to render it into a conductive gate line silicide 72 (FIG. 12). In another embodiment, refractory metal layer 70 constitutes a common refractory metal layer which is formed over both exposed silicon-containing material of transistor gate lines 36, 38, and the elevated source/drain material comprising regions 60, 62, and 64. Subsequently, layer 70 is exposed to annealing conditions which are sufficient to render it into both the gate line silicide 72 and a source/drain material silicide 74 (FIG. 12).

Referring to FIG. 12, and alternately considered, a gate line silicide layer 72 is formed over exposed material of gate lines 36, 38 respectively. Elevated source/drain region silicide layers 74 are formed over elevated source/drain material comprising portions of the source/drain regions. In a preferred embodiment, the silicide layers are contemporaneously provided over the illustrated materials. In this example, silicide layers 72, 74 are provided after provision of the impurity and the subsequent wet etching of the undoped semiconductive material.

Figure 13:
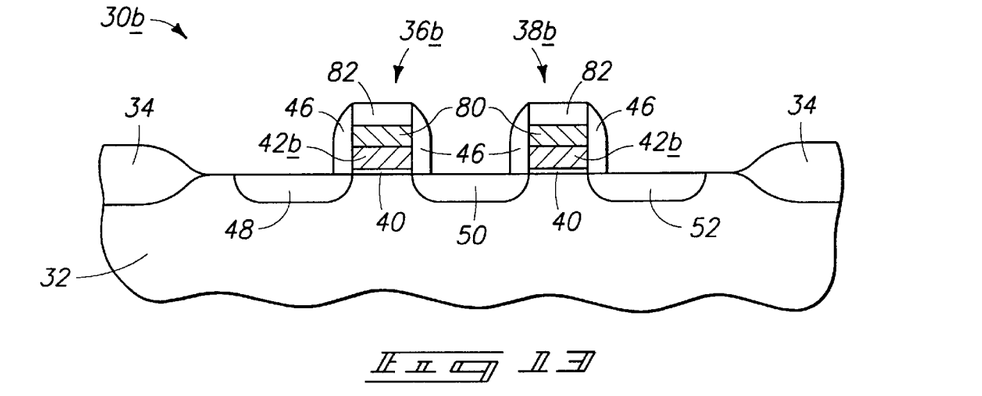
FIG. 13 is a diagrammatic side sectional view of a semiconductor wafer fragment in process in accordance with another embodiment of the present invention.

Referring to FIG. 13, a semiconductor wafer fragment in process in accordance with another embodiment of the invention is shown generally at 30b and includes a semiconductive substrate 32. Like numerals from the above-described embodiment have been utilized where appropriate with differences being indicated by the suffix "b" or with different numerals.

In this example, a pair of spaced-apart conductive lines 36b, 38b are formed over substrate 32 and include a gate oxide layer 40, a doped semiconductive material layer 42b, e.g. polysilicon, a silicide layer 80, e.g. tungsten silicide, and an insulative cap 82 comprising a material such as nitride. Layer 42b is preferably in-situ doped polysilicon.

Figure 14:
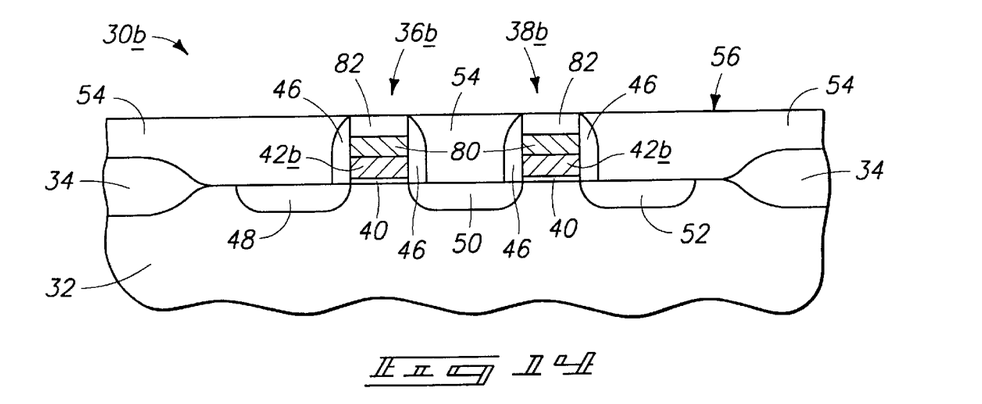
FIG. 14 is a view of the FIG. 13 wafer fragment at a processing step which is different from that which is shown in FIG. 13.

Referring to FIG. 14, a material layer 54 is formed over substrate 32, and preferably comprises an undoped semiconductive material. Layer 54 constitutes a second-formed layer of semiconductive material which is formed laterally proximate gate lines 36, 38 and joins with semiconductive material of substrate 32 laterally proximate each gate line, e.g. diffusion regions 48, 50, and 52. As formed, layer 54 constitutes elevated source/drain material for gate lines 36b, 38b. An exemplary material for layer 54 is undoped polysilicon which can be formed to an elevational thickness of around 4,000 Angstrom.

Material of layer 54 can be removed, as described above, to isolate remaining material relative to the conductive lines. In this example, layer 54 is planarized, as by chemical-mechanical polishing, to provide a generally planar outer surface 56. Planarization can be made to stop on or proximate insulative caps 82. Alternately, layer 54 can be etched back, with such etching stopping on or proximate the insulative caps. Although not specifically shown, further portions of layer 54 can be removed to recess the material relative to gate lines 36b, 38b.

Figure 15:
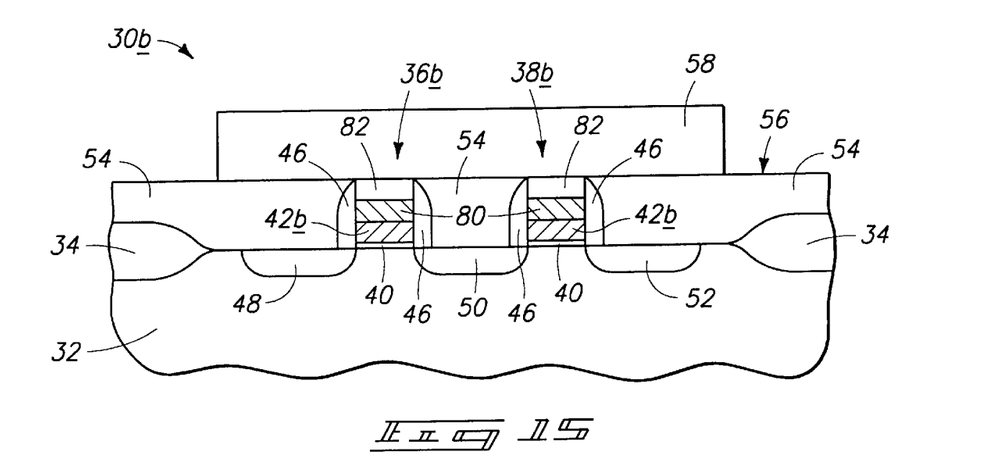
FIG. 15 is a view of the FIG. 13 wafer fragment at a processing step which is subsequent to that which is shown in FIG. 14.

Referring to FIG. 15, a patterned masking layer 58 is formed over substrate 32 and over portions of the undoped semiconductive material of layer 54. Exemplary material for layer 58 is photoresist.

Figure 16:
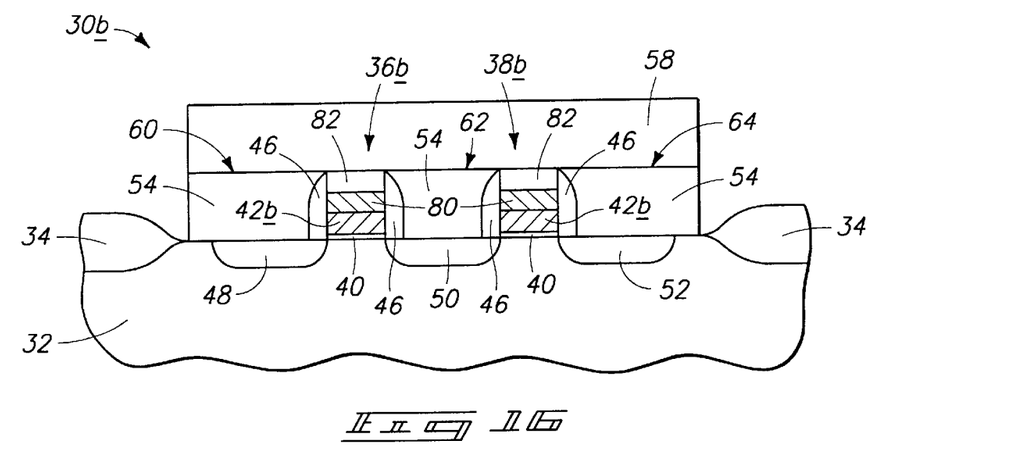
FIG. 16 is a view of the FIG. 13 wafer fragment at a processing step which is subsequent to that which is shown in FIG. 15.

Referring to FIG. 16, unmasked elevated source/drain material portions are removed to provide individual elevated source/drain regions 60, 62, and 64. In this example, such material is removed prior to provision of conductivity-modifying or conductivity-enhancing impurity thereinto. In one embodiment, the unmasked portions are is etched, preferably through an anisotropic dry etch, which is sufficient to provide the elevated source/drain regions.

Figure 17:
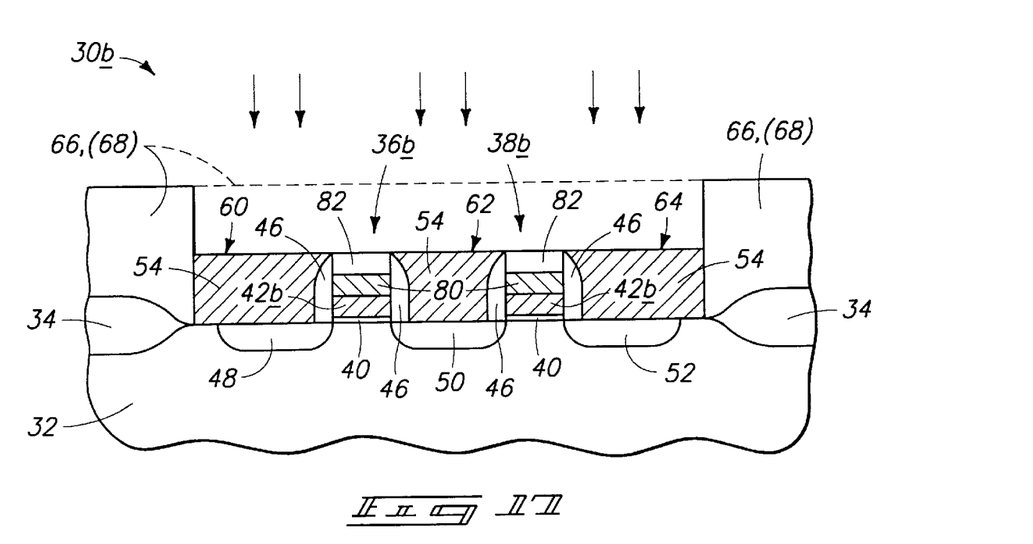
FIG. 17 is a view of the FIG. 13 wafer fragment at a processing step which is subsequent to that which is shown in FIG. 16.

Referring to FIG. 17, a patterned masking layer 66 is formed over substrate 32. In one embodiment, conductivity-modifying or conductivity-enhancing impurity is provided into the elevated source/drain material of regions 60, 62, and 64. Such impurity can be provided in the concentration mentioned above.

In one embodiment, material of the elevated source/drain regions 60–64 is doped in different steps. Such different steps can provide different impurity doses at different energy levels. In one embodiment, the semiconductive material is doped with a first dose of impurity which is provided at a first energy level, and then a second dose of impurity which is provided at a second energy level. The first dose is preferably substantially the same as the second dose, with an exemplary dose being $5 \times 10^{12}$ atoms/cm$^2$. Preferably, the second energy level is less than the first energy level, with an exemplary first energy level being 85 keV and an exemplary second energy level being 35 keV. Such will result in concentrations of implanted impurities which vary within the semiconductive material.

In another embodiment, a first region of elevated source/drain material is masked (with patterned masking layer 66 and not specifically shown) while a second region of elevated source/drain material (e.g. regions 60, 62, and 64) is doped with an impurity of a second type. In this example, masking layer 66 can be used to open up n-channel active areas to allow implantation of the undoped polysilicon thereover. Exemplary material for such doping include arsenic and/or phosphorous. In accordance with this embodiment, masking layer 66 is subsequently removed, and a second region of elevated source/drain material is masked, e.g. with masking layer 68, while a first region of elevated source/drain material (not specifically shown but disposed within masking layer openings which are substantially similar to the opening defined by previous masking layer 66) is provided with an impurity of a first type. In this example, masking layer 68 can be used to open up p-channel active areas to allow implantation of the undoped polysilicon thereover. Exemplary materials include boron and BF$_2$.

Subsequent processing, with respect to the formation of the elevated source/drain region silicide can take place as described in connection with FIGS. 7 and 8.

Figure 18:
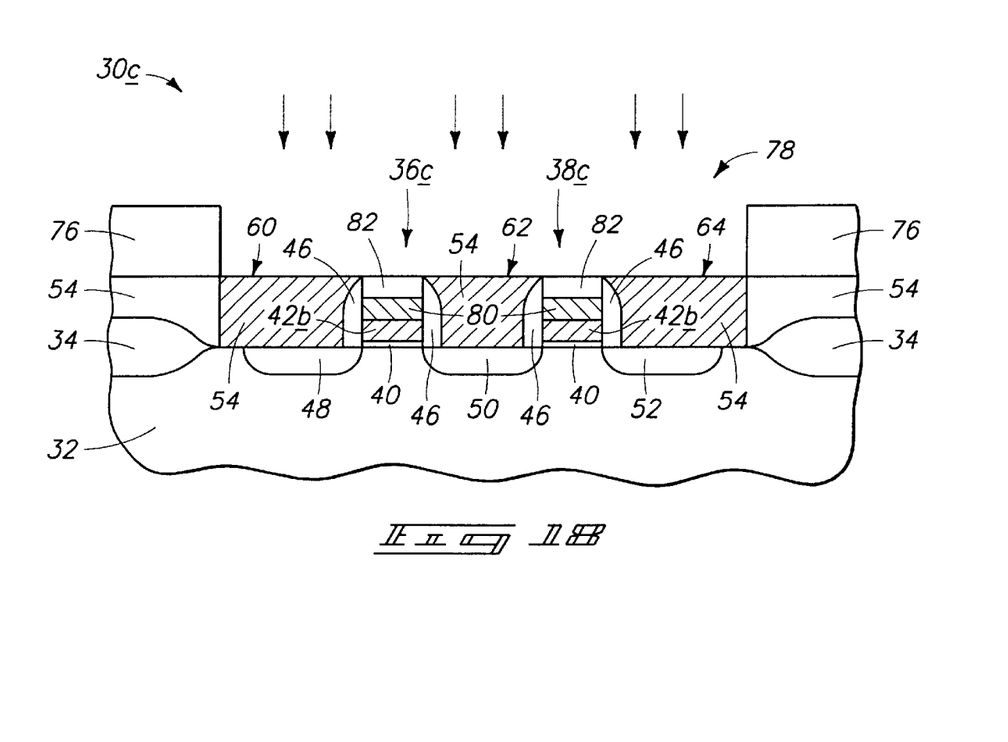
FIG. 18 is a diagrammatic side sectional view of a semiconductor wafer fragment in process in accordance with another embodiment of the present invention.

Referring to FIG. 18, a semiconductor wafer fragment in accordance with an alternate embodiment of the present invention is shown generally at 30c and includes a semiconductive substrate 32. Like numerals from the above-described embodiment have been utilized where appropriate, with differences being indicated by the suffix "c" or with different numerals.

A material layer 54 is formed over substrate 32 and processed as described above, which can include the planarization thereof. A patterned masking layer 76 is formed over the substrate including portions of undoped semiconductive material 54. Masking layer 76 defines a masking layer opening 78 which is disposed over only a portion of undoped semiconductive material of layer 54. Accordingly, material elevationally below masking layer 76 constitutes covered portions of layer 54, while exposed portions of layer 54 comprise elevated source/drain material regions for the field effect transistors.

Conductivity-modifying or conductivity-enhancing impurity is provided into exposed or unmasked portions of layer 54. Such impurity can be provided in the concentration mentioned above. Such materials can be doped as described above utilizing the first and second doses provided at the first and second energy levels, respectively. Accordingly, material of layer 54 disposed elevationally below masking layer 76 remains substantially undoped laterally outward of doped elevated source/drain regions 60, 62, and 64. After the provision of the impurity, the masking layer can be stripped.

Figure 19:
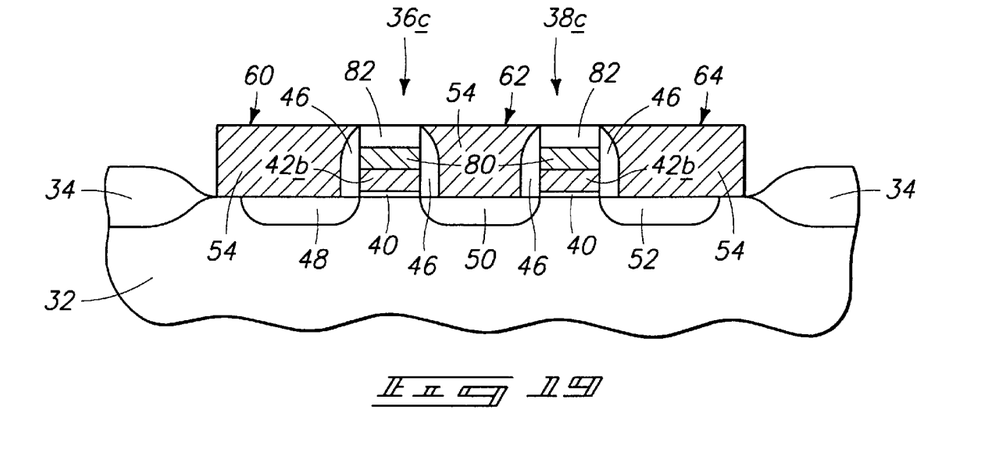
FIG. 19 is a view of the FIG. 18 wafer fragment at a processing step which is subsequent to that which is shown in FIG. 18.

Referring to FIG. 19, the undoped source/drain material portions are removed to provide elevated source/drain regions 60, 62, and 64. In a preferred embodiment, the removal of such material takes place through an etch which is effective to remove elevated source/drain material containing less impurity than elevated source/drain material containing more impurity. In the illustrated example, a wet etch is conducted which selectively removes undoped semiconductive material relative to the doped semiconductive material. An exemplary wet etch comprises two percent by volume tetramethyl ammonium hydroxide (TMAH) in water. Etch chemistries could, of course, be changed to achieve higher etch selectivity to doped versus undoped polysilicon. Accordingly, removal of the elevated source/drain material portions in this embodiment takes place after provision of the doping impurity and constitutes removing previously-masked portions of the semiconductive material layer to provide the elevated source/drain regions which comprise the previously-unmasked portions.

Subsequently, the substrate can be annealed such that both n+ and p+ plugs or source/drain regions is annealed at the same time.

Subsequent processing, with respect to the formation of the elevated source/drain region silicide can take place as described in connection with FIGS. 11 and 12.

Advantages of the present invention include improved CMOS formation techniques which use plugs or elevated source/drain regions over the p+/n+ active areas followed by a salicide process for sheet resistance reductions which improves robustness in the finished device. In addition, requirements of self-aligned contact etching in the previous DRAM processing flows can be reduced. Specifically, traditional formation of DRAM cells requires the use of a self-aligned contact etch through, for example, BPSG, to form DRAM cell capacitors. Various invented methods do not require such a self-aligned contact etch to form DRAM cell capacitors. The invented methods can also achieve n-channel and p-channel devices with elevated source/drain regions for better short channel characteristics without the use of additional masking steps. Moreover, realization of p+ polysilicon flows for p-type MOSFETs can be achieved without the use of any additional masks.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming integrated circuitry comprising:
   first forming a transistor gate line over a substrate, the transistor gate line comprising an undoped material and the substrate comprising source/drain diffusion regions proximate the transistor gate line;

after the first forming, blanket depositing a layer over the substrate, including over the source/drain diffusion regions; and after blanket depositing, etching the blanket deposited layer to form elevated source/drain structures proximate the transistor gate line.

2. The method of claim 1, further comprising providing conductivity-modifying impurity into the elevated source/drain structures.

3. The method of claim 2, wherein the providing comprises simultaneously providing conductivity-modifying impurity into the gate line and the elevated source/drain structures.

4. The method of claim 3, wherein first forming the transistor gate line comprises forming a gate dielectric layer over a substrate, forming semiconductive material over the gate dielectric layer and forming an insulative cap layer over the semiconductive material layer, and simultaneously providing the conductivity-modifying impurity into the gate line and the elevated source/drain structures comprises removing the insulative cap prior to providing the conductivity-modifying impurity.

5. The method of claim 2, wherein the providing is before the etching of the blanket deposited layer.

6. The method of claim 2, wherein the conductivity-modifying impurity is provided to a concentration of at least $10^{20}$ cm$^{-3}$ cm.

7. The method of claim 2, where the etching comprises:
forming a patterned masking layer over the blanket deposited layer, the patterned masking layer defining masked portions and unmasked portions of the layer; and
anisotropically etching the unmasked portions of the layer.

8. The method of claim 7, wherein the etching is before the providing of the conductivity-modifying impurity.

9. The method of claim 1, where the etching comprises:
forming a patterned masking layer over the blanket deposited layer, the patterned masking layer defining masked portions and unmasked portions of the layer; and
anisotropically etching the unmasked portions of the layer.

10. A method of forming integrated circuitry comprising:
forming a transistor gate line over a surface of a semiconductive substrate, the transistor gate line comprising an undoped material and the semiconductor substrate comprising source/drain diffusion regions proximate the transistor gate line;
subsequent to forming said transistor gate line, blanket forming a layer comprising semiconductive material over the transistor gate line and the surface, including over the source/drain diffusion regions, the layer joining with semiconductive material of the surface laterally proximate the gate line and the layer being disposed elevationally upward from the surface;
removing portions of the blanket formed layer to define elevated source/drain regions laterally proximate the transistor gate line; and
in a common step, providing conductivity-enhancing impurity into both the elevated source/drain material and the gate line.

11. The method of claim 10, wherein the conductivity-enhancing impurity is provided to a concentration of at least $10^{20}$ cm$^{-3}$.

12. The method of claim 10, wherein:
the forming of the transistor gate line comprises forming a gate oxide layer, an undoped semiconductive material layer over the gate oxide layer over the semiconductive material; and
the blanket forming of the layer comprising semiconductive material comprises planarizing the blanket formed semiconductive material layer relative to the insulative cap.

13. The method of claim 10, wherein the forming of the transistor gate line comprises forming a gate oxide layer, the undoped material layer over the gate oxide layer and an insulative cap over the semiconductive material, and further comprising prior to the providing of the conductivity enhancing impurity, removing the insulative cap.

14. The method of claim 10, further comprising after the providing of the conductivity enhancing impurity, removing elevated source/drain material portions to provide elevated source/drain regions.

15. The method of claim 10, wherein the providing of the conductivity-enhancing impurity is prior to the removing elevated source/drain material portions.

16. The method of claim 10, further comprising prior to the providing of the conductivity-enhancing impurity, forming a patterned masking layer over the substrate, wherein the providing of the conductivity-enhancing impurity comprises providing impurity into unmasked portions of the semiconductive material layer, and further comprising removing previously-masked portions of the semiconductive material layer to provide elevated source/drain regions comprising the previously unmasked portions.

17. A method of forming integrated circuitry comprising:
first forming a pair of spaced apart gate lines over a semiconductive substrate, the gate lines comprising a gate dielectric portion, a semiconductive material portion over the dielectric portion and an insulative cap portion over, the semiconductive material portion and the semiconductive substrate comprising source/drain diffusion regions proximate the transistor gate lines;
after the first forming, blanket depositing a layer comprising semiconductive material laterally proximate the gate lines and over the source/drain diffusion regions, the layer joining with semiconductive material of the substrate laterally proximate the gate lines, the blanket formed semiconductive material comprising elevated source/drain material for transistors formed of the gate lines;
removing portions of the blanket formed layer to define elevated source/drain regions;
commonly doping the blanket formed layer and the semiconductive material layer with a conductivity enhancing impurity.

18. The method of claim 17, wherein the commonly doping comprises:
a first common doping with a first dose of impurity provided at a first energy level; and
a second common doping with a second dose of impurity provided at a second energy level.

19. The method of claim 17, wherein prior to the common doping, the insulative cap is removed.

20. The method of claim 17, wherein the removing portions of the blanket formed layer is after the common doping.

* * * * *

UNITED STATES PATENT AND TRADEMARK OFFICE
CERTIFICATE OF CORRECTION

PATENT NO. : 6,444,529 B2
DATED : September 3, 2002
INVENTOR(S) : Aftab Ahmad

It is certified that error appears in the above-identified patent and that said Letters Patent is hereby corrected as shown below:

Column 7,
Line 4, delete "is" after the word -- are --.

Column 9,
Line 29, delete "cm" after -- $cm^{-3}$ --.

Column 10,
Lines 3-5, replace "an undoped semiconductive material layer over the gate oxide layer over the semiconductive material; and" with -- the undoped material over the gate oxide layer and an insulative cap over the semiconductive material; and --.
Line 36, replace "a semiconductive material portion" with -- an undoped semiconductive material portion --.
Line 38, replace "portion over, the semiconductive material portion" with -- portion over the undoped semiconductive material portion --.

Signed and Sealed this

Eleventh Day of January, 2005

JON W. DUDAS
*Director of the United States Patent and Trademark Office*